United States Patent [19]
Miller et al.

[11] Patent Number: 6,163,867
[45] Date of Patent: Dec. 19, 2000

[54] INPUT-OUTPUT PAD TESTING USING BI-DIRECTIONAL PADS

[75] Inventors: John Miller, Rocklin; Richard Ortiz, Roseville, both of Calif.; Chenmin Zhang, Fort Collins, Colo.

[73] Assignee: Hewlett-Packard Company, Palo Alto, Calif.

[21] Appl. No.: 09/141,957

[22] Filed: Aug. 28, 1998

[51] Int. Cl.[7] .................................................. G01R 31/28
[52] U.S. Cl. .......................................... 714/736; 324/763
[58] Field of Search ..................................... 714/736, 733, 714/735, 742, 25, 27, 30, 37, 43, 44, 745, 32, 56; 324/763, 754, 760

[56] References Cited

U.S. PATENT DOCUMENTS

| | | | |
|---|---|---|---|
| 4,743,841 | 5/1988 | Takeuchi | 324/73 R |
| 4,956,602 | 9/1990 | Parrish | 324/158 R |
| 5,477,160 | 12/1995 | Love | 324/755 |
| 5,504,354 | 4/1996 | Mohsen | 257/209 |
| 5,627,842 | 5/1997 | Brown et al. | 371/22.3 |
| 5,648,730 | 7/1997 | Bhuva et al. | 324/763 |
| 5,654,564 | 8/1997 | Mohsen | 257/209 |
| 5,661,407 | 8/1997 | Shibata | 324/763 |
| 5,671,234 | 9/1997 | Phillips et al. | 371/22.3 |
| 5,760,596 | 6/1998 | Peiffer et al. | 324/715 |
| 5,771,240 | 6/1998 | Tobin et al. | 371/22.1 |
| 5,774,477 | 6/1998 | Ke | 371/22.32 |
| 5,825,194 | 10/1998 | Bhuva et al. | 324/763 |
| 5,948,114 | 9/1999 | Klingler | 714/733 |
| 5,959,914 | 9/1999 | Gates et al. | 365/201 |

*Primary Examiner*—Nadeem Iqbal

[57] ABSTRACT

A method and a system for testing integrated devices such as chips used on a printed circuit board. The system includes test logic formed on the chip and coupled to bi-directional input/output pads. The system is capable of testing input pads, output pads, and bi-directional pads by coupling an input test signal from one pad of a pair of pads to the output of a second pad of the pair of pads. If the signal read out of the second pad corresponds to the expected value, the pads may be considered properly connected. The chips may be tested at any stage during chip manufacture, including after forming the die on a wafer, after cutting the die from the wafer and after packaging the die to produce the chip, and after attaching the chip to a printed circuit board. The system and method allow for quick and easy testing of pad connectivity during the manufacturing process, while minimizing the number of extra gates and trace lines on the chip.

29 Claims, 6 Drawing Sheets

INPUT-OUTPUT PAD TESTING USING BI-DIRECTIONAL PADS

FIELD OF THE INVENTION

The invention relates to testing electronic assemblies including components mounted on printed circuit boards. In particular, the invention relates to testing input and output pads found on the components.

DESCRIPTION OF RELATED ART

Very large scale integrated (VLSI) circuit technology is rapidly changing due to the increases in VLSI circuit complexity, coupled with higher performance and smaller sizing requirements. Increasing importance of improving manufacturing testing techniques at all levels of VLSI integration is emerging due to newer technology, pressures for higher production yield requirements, and tighter time-to-market schedules. Boundary scan testing methodology is well known in the art. Generally, boundary scan testing is a technique used to map a sequential circuit test generation problem into a combinational circuit test generation problem. However, circuits must be pre-designed to include a scan path test hardware, which may include isolated or integrated scan or shadow registers.

In a typical example, a memory card may be populated by several integrated circuit (IC) chips, each chip being a random access memory unit, for example. The random access memory ICs are generally either dynamic random access memory (DRAM) or static random access memory (SRAM). Both DRAM and SRAM are well known in the art to be forms of volatile memory.

Memory cards populated with memory chips frequently have the chips soldered into place on the printed circuit board of the memory card. During the soldering process, an integrated circuit chip can be damaged. Also, the soldered connections may be defective. There are basically two types of defective soldered connections. In the first type, an open condition occurs such that there is no electrical connection from a pin of the IC chip to the printed circuit board. In the second type of solder defect, a short exists such that two or more pins are connected together electrically. If the IC has been damaged, or a solder defect has occurred, the memory card will not function properly. Therefore it is desirable to test the connectivity of each pin of an IC to the printed circuit board. Such a test is commonly called a boundary scan test because the pins of the IC form the boundary of the circuit through which the IC interfaces with the memory card.

Testing a chip is also important during other phases of chip construction. For example, after the die is formed on a wafer, and after the die is cut from a wafer, it is important to test connectivity of the individual components of the die. In these cases, a boundary scan test can also be performed to check the connectivity.

In the case of DRAM and SRAM for example, a boundary scan can be performed quickly using a programmable tester and testing methods that are well known in the art. In a typical boundary scan test the memory card is inserted into a testing unit. The testing unit sets all of the memory units to a known state, for example, storing all zeros or all ones. Next, the tester will pick an area of interest on one of the memory units and write a pattern to that area of interest. The tester then reads the area of interest to compare the pattern written to the pattern read. If the pattern written does not match the pattern read, then a first type of defect has been found. The tester then reads all other areas of the memory unit, and of the other memory units to see if the known state of these areas has changed. If the known state has changed, then a second type of defect has been found. The tester then writes another pattern to the area of interest. Typically, a first pattern will be a checkerboard pattern (e.g., 010101 ... ) and the second pattern will be a compliment checkerboard (e.g., 101010 ... ). The second pattern is then read back and compared to verify that the second pattern was stored properly. All of the other areas of the memory unit and the other memory units are again checked to verify that storing the second pattern has not changed the known state of these areas. Once the first area of interest of the first chip has been tested, a new area of interest is selected and the test process outlined above is repeated until the entire first chip has been tested. Each of the other chips of the card are also tested in a similar manner.

An alternate way to perform a boundary scan of a memory card would be to add joint test access group (JTAG) boundary scan pins and circuitry to each chip. A JTAG boundary scan is well known in the art. In a JTAG scan, test circuitry and extra JTAG pins are added to each chip. The JTAG pins for each chip are then connected in series, and a series of commands are issued through the pins to a test circuitry on board the chips to read back data and verify that the inner connections have been properly made. Details of the JTAG boundary scan can be found in IEEE1149.1 standard (IEEE Press, 1992).

While boundary scan testing, including JTAG testing, works well to determine the overall connectivity of an integrated circuit, this testing method may be complicated and require the addition of extensive test logic circuitry. Because testing the connectivity of a die or chip is important to identify potentially defective components before they are integrated into a VLSI circuit, for example, a testing method that is simple and quick to execute is desired. Preferably, this method will not require the addition of complex test logic.

SUMMARY OF THE INVENTION

This invention is directed to a system and method for testing pad connectivity using bi-directional pads on integrated circuit components or chips. The chips may have many pins or legs, and each of the pins or legs has an associated pad. In today's world more and more chips and components are being made with bi-directional pads as opposed to unidirectional pads. Thus, there are many bi-directional pads on a chip and each of these pads may be tested during chip manufacturing and circuit board assembly.

Generally, bi-directional pads can be configured or directed to be input pads or output pads. The system and method of the invention can be used to test any type of pad, as long as bi-directional pads are used in place of input-only pads and output-only pads, and as long as these bi-directional pads are configured as input-only and output-only pads for normal operations. Preferably, the bi-directional pads to be tested are each paired with an adjacent bi-directional pad and connected to that adjacent bi-directional pad with digital logic components. In that way, a signal can be provided on one pad, the input or receiving pad, and transferred to the connected adjacent pad which acts as an output pad. The signal can then be read, tested, or sensed as an output from the second, or output pad. The bi-directional pads on the chips may be grouped as pairs and classified as "ODD" and "EVEN" bi-directional pads. A test enable circuit, which may be included as part of the chip's core logic, determines if the pad will operate in a normal mode or in a test mode.

To test a chip, test signals are provided to connections on the chip. The test signals may be provided by a chip tester, or similar device, for example. Such chip testers are well known in the art. The chip tester is coupled to the chip and may be programmed to test the chip in either an EVEN or an ODD mode. For example, the desired test signals and the expected output signals may be programmed into the chip tester. The chip tester provides the necessary test signals and provides a readout of the results. Data related to the resulting output signals may be captured and verified. The data will indicate which of the bi-directional pads provided the expected output and which did not. Defective chips may be discarded, or the test results may be used as a diagnostics tool to determine if problems exist with the manufacturing process.

While the system and method are described with reference to circuits in which active signals are high, or 1, with minor modifications, the system could be used with active signals that are low, or 0 (i.e., inverse logic). Furthermore, the system and the method are adaptable, with minor modification to three-state testing of all pads. That is, the system can accommodate testing of pads having a third output state, such as a high impedance or open circuit, for example.

When a test enable signal from the test enable circuit is set low, the bi-directional pad is in a test mode, and an input signal supplied, for example, to the ODD bi-directional pad is routed to the EVEN bi-directional pad. This signal then forms the signal that checks pad connectivity from the pad input to the pad output. Thus, each bi-directional pad on the chip can be checked in both the input and output directions.

Typically, digital signals are used to test pins or pads, customarily, a digital signal of one (1, or high) or zero (0, or low). In the novel methods, to ensure that the two adjacent pads are not shorted together due to a problem, the signal received by the input pad is inverted or changed, for example, from a 1 to a 0 and then transferred to the output pad. This can be done, for example, by using an inverter.

In an embodiment, the digital logic components connecting adjacent pads, or the test logic components, are an OR gate, an AND gate, two inverters, and a multiplexer.

To test a pair of adjacent bi-directional pads connected by the test logic, a digital signal representing 1, or high, is provided to one pad, the input pad for the test. After receiving the 1 on the input pad, the test logic inverts or changes the digital signal from 1 to 0 and transfers the digital signal (0) to the connected adjacent output pad. The output pad drives the digital signal (0) as its output. The output signal is then read and compared to the desired output (0) for a digital signal input of 1 that was provided to determine if the pads passed the test.

Since each bi-directional pad by definition can act as either an input pad or an output pad, each pad may be tested twice, once while acting as an input pad and once while acting as an output pad. To accomplish this bi-directional testing, the role of each pad is reversed; the output pad becomes the input pad and the input pad becomes the output pad. Before each test, the test logic sets up, configures, or informs each pad of its duty or role as an input pad or output pad.

While the test procedure is described for one pair of adjacent bi-directional pads, it can be performed on many pairs of pads simultaneously and quickly. For example, with a plurality of pads, one pad of each of the pad pairs is configured as an input pad while the other pad is configured as an output pad. Test signals are sent to the input pads, and the return signals are read from the output pads. For the second part of the test, the roles of the pads are reversed. These tests are defined as an EVEN test and an ODD test.

The benefit of this test arrangement is that connectivity can be quickly and easily tested while minimizing the number of extra gates required to be placed on the die. The testing can be completed at any stage of the chip manufacturing process including after forming the die on a wafer, after cutting the die from the wafer and packaging the die, and after mounting the chip on a printed circuit board. The testing can also be conducted at any point during the operation of a device that includes the chip. Thus, the testing can be used as a diagnostic tool to assist in failure analysis. Finally, this test arrangement has little effect on operational timing of the chip because the extra impedances associated with the test circuitry are minimized.

Other objects, features and advantage of the invention will be apparent from the accompanying drawings and the detailed description that follows.

BRIEF DESCRIPTION OF THE DRAWINGS

The invention will be described with reference to the following drawings, wherein like numerals refer to like objects and wherein.

DETAILED DESCRIPTION OF THE INVENTION

While the discussion that follows refers primarily to bi-directional pads, the method and the system may be used to test any type of pad, provided bi-directional pads are used in place of input-only pads and output-only pads, and provided the bi-directional pads are configured as input-only and as output-only pads, for normal operation.

Figure 1:
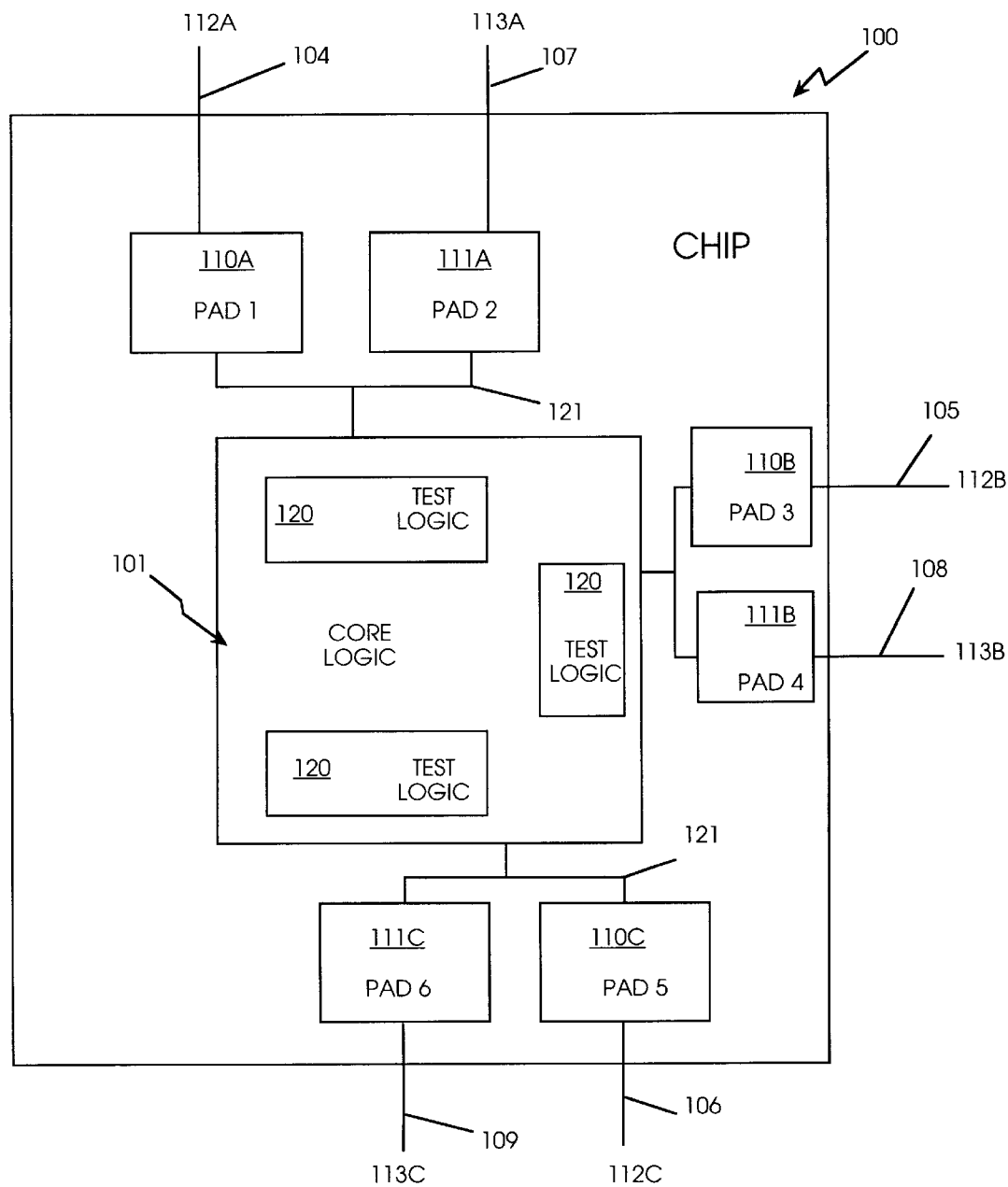
FIG. 1 is a high-level block diagram of an integrated circuit in which the present invention resides.

FIG. 1 shows an integrated circuit component, or chip 100, that is designed to allow performance of input/output tests using bi-directional pads. Included on the chip 100 are functional bi-directional input/output (I/O) pads 110A–110C and 111A–111C and a core logic 101. The pads are functionally bi-directional because signals received from off-chip can be processed by components of the core logic 101, and signals generated by the core logic 101 can be sent off-chip. The bi-directional I/O pads are arranged in pairs such that bi-directional pads 110A and 111A form a pair, for example. Although FIG. 1 shows a total of three bi-directional I/O pad pairs, the chip 100 is not limited to this configuration, and additional bi-directional I/O pads may be installed. The arrangement of bi-directional pads into pairs is arbitrary, and assigning adjacent bi-directional I/O pads as a pair is only an example of this arrangement. Finally, pads other than I/O pads (i.e., power and ground pads) may not be tested by this system.

The bi-directional pads 110A–110C connect to connections 112A–112C through signal paths 104–106, respectively. In a chip installed on a printed circuit board, the connections 112A–112C may be pins, for example. The bi-directional pads 111A–111C connect to connections 113A–113C through signal paths 107–109, respectively. Each of the bi-directional pads 110A–110C and 111A–111C connect to digital test logics 120 through signal paths 121. The digital test logics 120 are coupled to the chip core logic 101.

FIG. 1 shows the digital test logics 120 as collocated with the core logic 101. However, the digital test logics 120 may also be installed in whole or in part in an area immediately adjacent to the bi-directional pads 110A–110C and 111A–111C around the periphery of the chip 100.

In normal operation, the bi-directional pads 110A–110C and 111A–111C may operate in a bi-directional mode. That is, the bi-directional pads 110A–110C and 111A–111C may connect as both input and output pads depending on the function of the core logic 101. When operating in the normal mode, pad testing portions of the digital test logics 120 may be disabled and thus have little effect on the operation of the chip 100.

In a test mode, which may be determined by programming a chip tester, a signal input to the bi-directional pad 110A, for example, is used as part of the test signal that tests the connectivity of the input portion of the bi-directional pad 110A and the output portion of the bi-directional pad 111A. Chip and board testers and techniques for their use in testing integrated circuit devices are well-known, and need not be described here. In this example, a signal applied at the connection 112A, which is fed through the signal path 104 and the bi-directional pad 110A, is coupled to the digital test logic 120 for the bi-directional pad 111A and may be read out at the connection 113A. Likewise, a signal at the connection 113A serves to test the input portion of the bi-directional pad 111A and the output portion of the bi-directional pad 110A. In this way, both the input and output connections of each pad may be tested for connectivity without the addition of an extensive on-chip test circuit.

Figure 2:
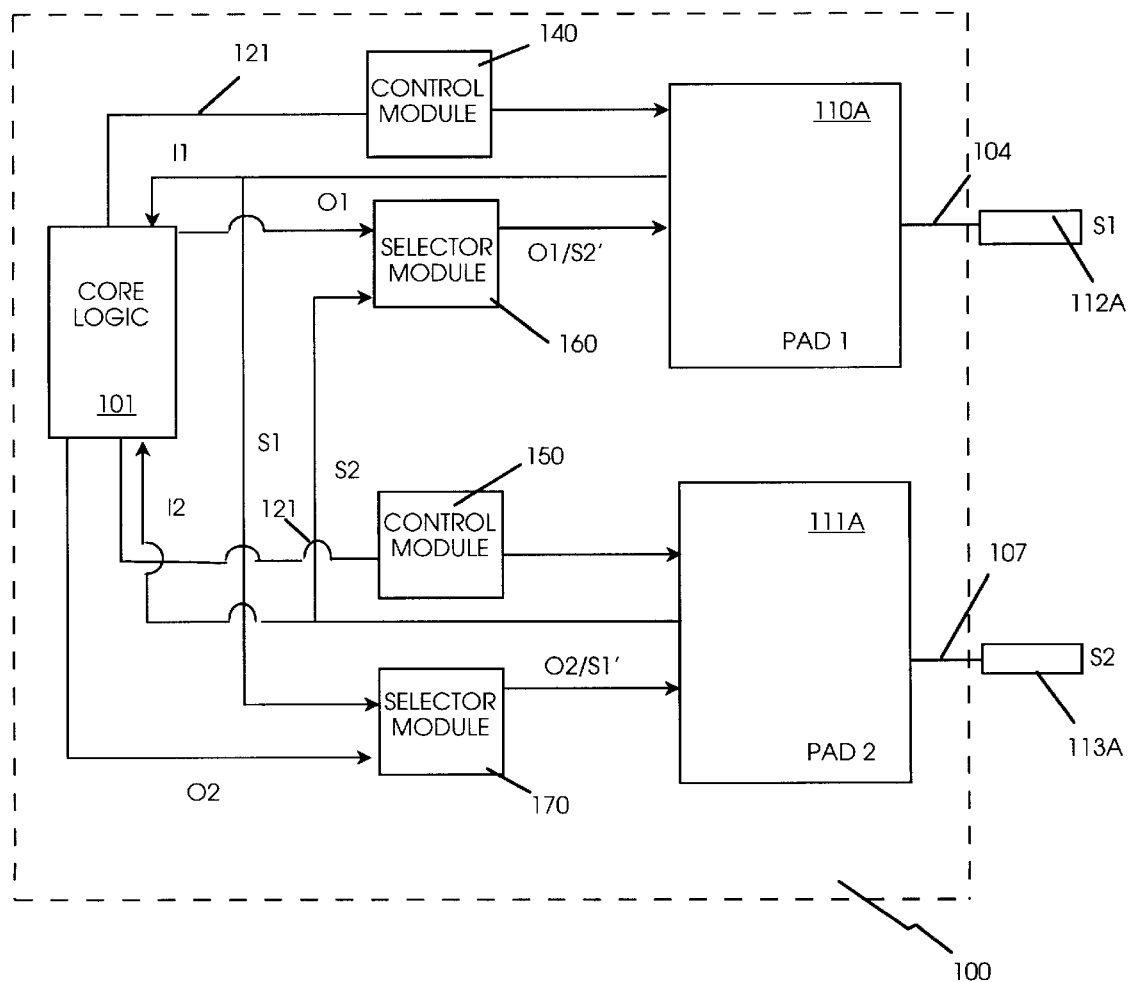
FIG. 2 is a block diagram showing the major components of an input/output test system.

FIG. 2 is a block diagram of the major components of the input/output test system residing on the chip 100. The system includes the bi-directional pads 110A and 111A with their respective signal paths 104 and 107 and connections 112A and 113A. A control module 140 coupled to the core logic 101 via the signal path 121 operates to configure the bi-directional pad 110A as an input pad or an output pad. Similarly, a control module 150 operates to configure the bi-directional pad 111A as an input pad or an output pad.

A selector module 160 receives an output signal O1 from the core logic 101 and the signal S2 from the adjacent bi-directional pad111A. The selector module 160 then operates to invert the signal S2 to produce an inverted signal S2' and to supply either the inverted signal S2' or the output signal O1 to the bi-directional pad 110A. When the inverted signal S2' is supplied to the bi-directional pad 110A, the inverted signal S2' may be read out on the signal path 104.

The selector module 170 operates in the same manner as the selector module 160 to produce an inverted output S1' or an output signal O2 on the signal path 107.

As is also shown in FIG. 2, the signals S2 and S1 may be supplied to the core logic 101 as input signals I2 and I1, respectively.

Figure 3:
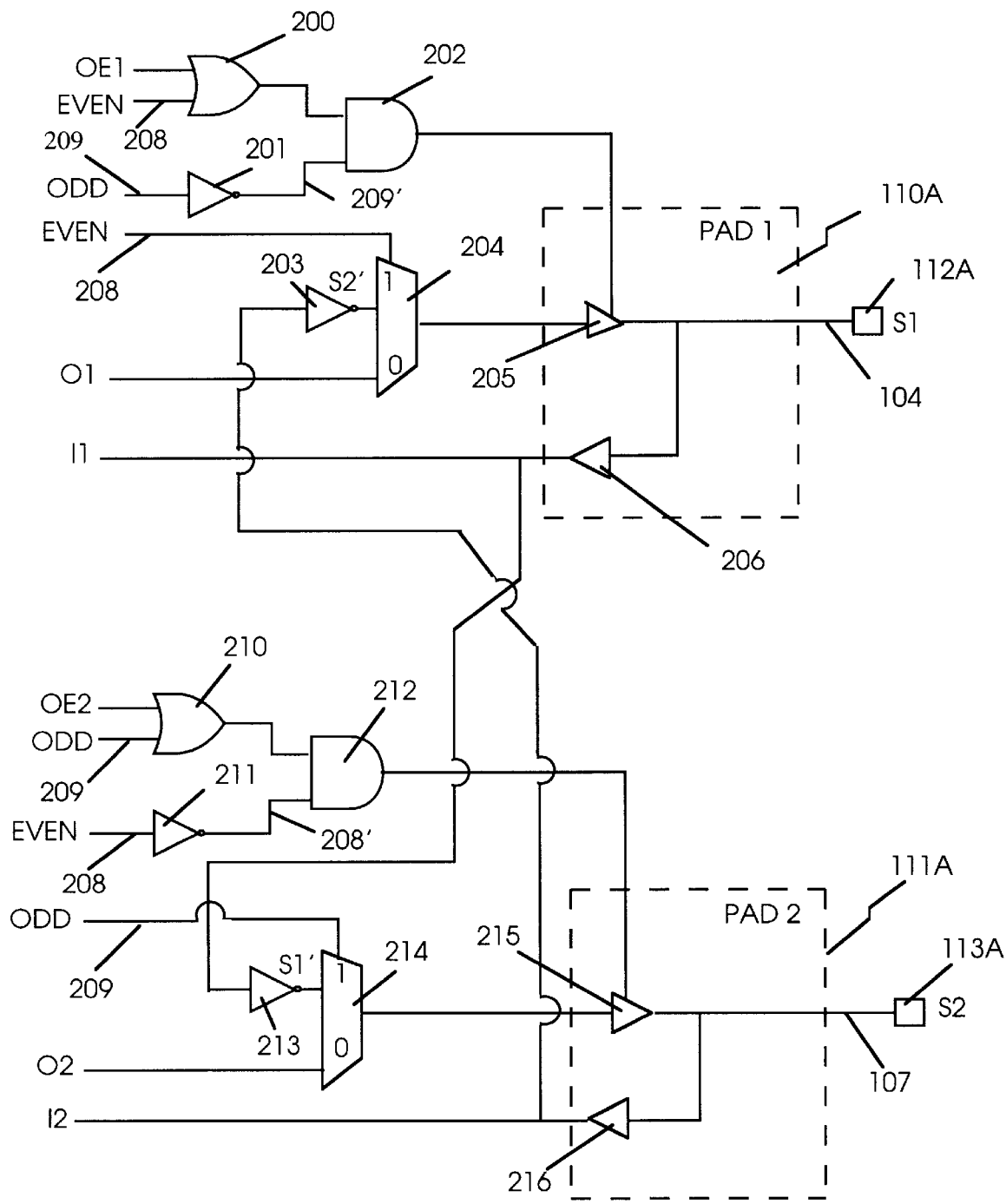
FIG. 3 is a schematic of the input/output test system.

FIG. 3 is a schematic of the input/output test system showing individual components in more detail. In FIG. 3, the bi-directional pads 110A and 111A are arranged as a pair. When installed on a printed circuit board, for example, the bi-directional pads 110A and 111A may connect to off-chip components, such as DRAMs (not shown), via the signal path 104 and the connection 112A and the signal path 107 and the connection 113A, respectively. Thus the signal paths 104 and 107 carry a signal S1 to or from the bi-directional pad 110 and a signal S2 to or from the bi-directional pad 111A, respectively. The bi-directional pad 110A includes an output driver 205 and a receiver 206.

Coupled to the bi-directional pad 110A are components of the digital test logic 120. In particular, an OR gate 200, an AND gate 202 and an inverter 201 are coupled to the output driver 205 of the bi-directional pad 110A. Also coupled to the output driver 205 is a multiplexer (MUX 204. The multiplexer 204 receives an output signal O1, a first, or EVEN test signal 208 and an output of an inverter 203. The receiver 206 provides an input signal I1 to the core logic 101.

The OR gate 200 receives an output enable signal OE1 from the core logic 101 and the EVEN test signal 208. The inverter 201 receives a second, or ODD test signal 209. The AND gate 202 receives an output of the inverter 201 and an output of the OR gate 200.

The bi-directional pad 111A includes an output driver 215 and a receiver 216. The digital test logic 120 associated with the bi-directional pad 111A includes an OR gate 210, an inverter 211 and an AND gate 212. The digital test logic 120 also includes an inverter 213 and a MUX 214. As shown in FIG. 3, the inverter 213 receives the signal S1 from the receiver 206 of the bi-directional pad 110A. The signal S1 from the receiver 206 is inverted by the inverter 213 and is supplied (S1') to the MUX 214. Also supplied to the MUX 214 are the output signal O2 and the ODD test signal 209. The output of the MUX 214 is supplied to the output driver 215. Signals (e.g., the signal S2) input to the bi-directional pad 111A over the signal path 107 pass through the receiver 216 and are supplied to the core logic as the input signal I2. The signal S2 from the receiver 216 is also supplied to the input of the inverter 203, where it is inverted (S2') and supplied to the MUX 204.

The OR gate 210 receives an output enable signal OE2 from the core logic 101 and the ODD test signal 209. An output of the OR gate 210 is supplied to the input of the AND gate 212. The EVEN test signal 208 is supplied to the inverter 211 where it is inverted and supplied (208') to the AND gate 212. An output of the AND gate 212 is then supplied to the output driver 215.

In an embodiment, every I/O pad on the chip 100 is functionally a bi-directional pad. The chip 100 can operate in at least three modes: normal, odd, and even. In an example of the normal operation, the bi-directional pad 110A is a "ODD" bi-directional pad with input signal I1 to the core logic 101 that comes from the connection 112A (S1), output signal O1 that goes to the connection 112A (S1), and the output enable signal OE1 that controls whether the output signal O1 connects to the connection 112A (S1). The bi-directional pad 111A represents a "EVEN" bi-directional pad with an input signal I2 to the core logic 101 that comes from the connection 113A (S2), an output signal O2 that goes to the connection 113A (S2) and the output enable OE2 that controls whether the output signal O2 connects to the connection 113A (S2). When operating in the normal mode, the output enable signal OE1, when set, indicates that the bi-directional pad 110A is acting as an output pad, and the output enable signal OE2, when set, indicates that the bi-directional pad 111A is acting as an output pad. That is, in the normal mode, the output signals O1 and O2 drive the signals S1 and S2, respectively, when their respective output enable signals, OE1 and OE2 are set. For example, when the output enable signal OE1 is set, the output of the OR gate 200 is 1 (high), the output of the AND gate 202 is 1 (high), and the output driver 205 is biased to provide the output signal O1 from the MUX 204 through the signal path 104 to the connection 112A (S1). Thus, the output enable signal OE1 determines the direction (output or input) of signals on the bi-directional pad 110A. Similarly, the output enable signal OE2 determines the direction (output or input) of signals on the bi-directional pad 111A.

Operation of the test modes will now be described with reference to FIG. 3. As noted above, two test modes are available for testing connectivity of the bi-directional pads. In the EVEN mode, the EVEN test signal 208 is 1 (high) and every EVEN bi-directional pad acts as an input pad. Every ODD bi-directional pad acts as an output pad. The value of the input signal on the EVEN bi-directional pad is inverted and is output to the ODD bi-directional pad.

In the ODD mode, the ODD test signal 209 is 1 (high) and every ODD bi-directional pad acts as an input pad. Every EVEN bi-directional pad acts as an output pad. The value of the input signal on the ODD bi-directional pad is inverted and is output to the EVEN bi-directional pad. As shown in FIG. 3, the bi-directional pad 110A is an ODD pad and the bi-directional pad 111A is an EVEN pad.

In the EVEN mode, the bi-directional pad 110A acts as an output pad and the bi-directional pad 111A acts as an input pad. The output enable signal OE1 can be high or low but is ignored, and the EVEN test signal 208 is high, or 1. The output enable signal OE1 and the EVEN test signal 208, which are input to the OR gate 200, result in an output from the OR gate 200 of 1, or high. The ODD test signal 209 is low, or 0, at the inverter 201. The inverter 201 inverts the ODD test signal 209 to 1, or high. The inputs to the AND gate 202 are the inverted ODD test signal 209' (high) and the high output signal from the OR gate 200. The output of the AND gate 202 is therefore high, or 1. The output of the AND gate 202 is fed to the output driver 205 causing the bi-directional pad 110A to operate as an output pad.

The OR gate 210 receives two inputs, an output enable signal OE2 that is ignored and a low, or 0, ODD test signal 209. The output of the OR gate 210 is therefore 0. The EVEN test signal 208 (high, or 1) is inverted by the inverter 211 and is then sent to the AND gate 212. The AND gate 212 receives the low, or 0, or high or 1, input from the OR gate 210, and the low, or 0, input from the inverter 211. The AND gate outputs a low, or 0, signal to the output driver 215. The output driver 215 is not activated, and the bi-directional pad 111A is configured as an input pad.

In the EVEN mode, the MUX 204 operates to send a test signal to the bi-directional pad 110A. Specifically, the MUX 204 receives the output signal O1, which can be high or low, and an inverted signal S2'. The inverted signal S2' originates at the input to the bi-directional pad 111A as the signal S2 and is inverted by the inverter 203. The inverted signal S2' is sent to the MUX 204. The output of the MUX 204 is coupled to the output driver 205. The EVEN signal 208 into the MUX 204 selects S2' as the output of the MUX 204. Because the bi-directional pad 110A is configured as an output pad, the inverted signal S2' is read at the connection 112A.

In the ODD mode, the bi-directional pad 111A acts as an output pad. Specifically, the output enable signal OE2 and the ODD test signal 209 are input to the OR gate 210. The output enable signal OE2 is low, or 0, or high, or 1, but is ignored, and the ODD test signal 209 is high, or 1. The output of the OR gate 210 is therefore high, or 1. The EVEN test signal 208 is low, or 0, and is inverted by the inverter 211. The AND gate 212 therefore receives the high output of the OR gate 210 and the inverted (high, or 1) EVEN test signal 208'. The output of the AND gate 212 is therefore high, or 1. The output driver 215 receives the output of the AND gate 212 and the bi-directional pad 111A is therefore configured as an output pad.

Returning to the bi-directional pad 110A, the output enable signal OE1 is ignored and the EVEN test signal 208 is low, and hence the output of the OR gate 200 is ignored. The ODD test signal 209 is inverted by the inverter 201 and thus the output of the AND gate 202 is low. The low, or 0, output signal from the AND gate is sent to the output driver 205, and hence the bi-directional pad 110A is configured as an input pad.

In the ODD mode, the MUX 214 operates to send a test signal to the pad 111A. Specifically, the MUX 214 receives the output signal O2, which is ignored, and an inverted signal S1'. The inverted signal S1' originates at the input to the bi-directional pad 110A as the signal S1 and is inverted by the inverter 213. The output of the MUX 214 is coupled to the output driver 215. The ODD signal 209 into the MUX 204 selects S1' as the MUX 214 output. Because the bi-directional pad 111A is configured as an output pad, the inverted signal S1' is read at the connection 113A.

Figure 4:
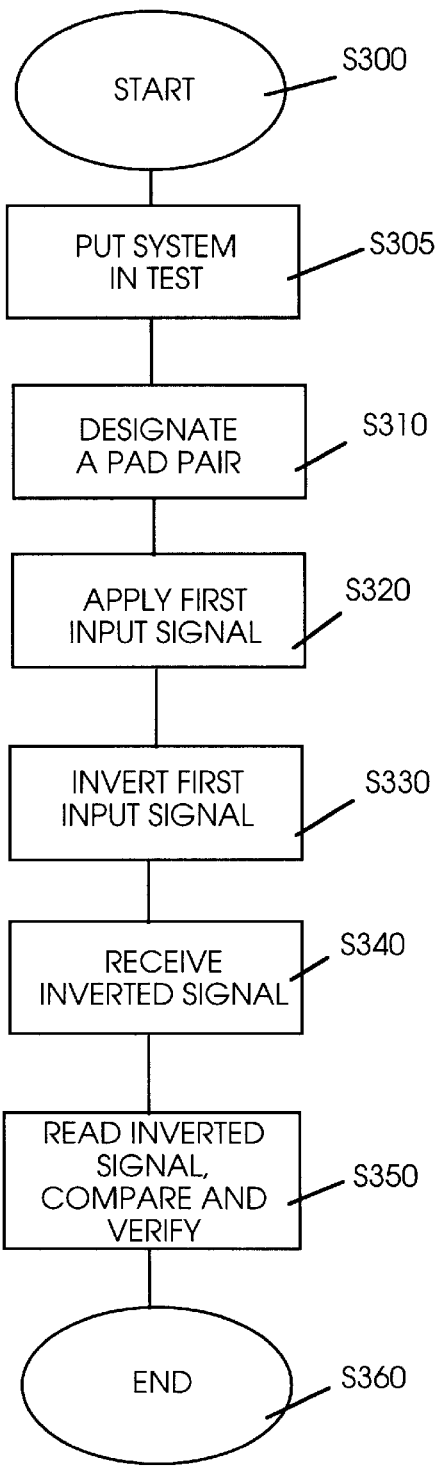
FIG. 4 is a flow chart illustrating operation of the test system of FIG. 3.

FIG. 4 is a flow chart showing an operation of the test system depicted in FIG. 3. In FIG. 4, the process starts at step S300. In step S305, the test system is placed in the test mode. The process then moves to stop S310. In step S310, the input and output pads on the chip 100 are designated as pad pairs. Preferably, adjacent pads are designated as pad pairs. In the example illustrated in FIG. 3, the bi-directional pads 110A and 111A are designated as a pad pair. The process then moves to step S320. In step S320, the signal S2 is applied to the input (signal path 107) of the bi-directional pad 111A. The signal S2 is then routed to the core logic 101 (as the input signal I2) and to the inverter 203. The process then moves to step S330.

In step S330, the signal S2 is inverted by the inverter 203 to produce the inverted signal S2'. The process then moves to step S340. In step S340, the inverted signal S2' is received at the output driver 205 of the pad 110A. Because the output driver 205 is biased by the AND gate 202 to provide output signals, the inverted signal S2' is sent to the signal path 104. The process then moves to step S350. In step S350, the inverted signal S2'is read on the signal path 104, is compared to the expected value and is verified. The process then moves to step S360 and ends.

In the above process, testing of one pad pair was described, with the signal S2 applied to one pad of the pad pair. However, all pad pairs on the chip 100 may be tested simultaneously. Furthermore, all pad pairs may be tested in both directions. That is, to complete the testing, the signal S1 may be applied to an input of the bi-directional pad 110A and the inverted signal S1' read out on the signal path 107 of the bi-directional pad 111A. Finally, the testing of the pad pairs in this second direction may also be performed simultaneously for all pad pairs.

In another embodiment, one or more of the pads may be an input only or an output only pad. For example, the bi-directional pad 110A could instead be configured functionally as an input pad only and the bi-directional pad 111A remains functionally a bi-directional pad. That is, in normal operation the signal S1 at the connection 112A is an input only. The pad 110A may be configured functionally as an input pad when it is used to receive inputs from a keyboard, for example.

When one or more pads are designed functionally as inputs or outputs only, further circuit simplification is possible. For example, when the bi-directional pad 110A is used functionally as an input pad only, the output enable signal OE1 will always be 0. The pad 110A switches to an output mode when testing in the EVEN mode. That is, the EVEN test signal 208 could be high or low. When the EVEN test signal 208 is high, the pad 110A provides a test output signal. Thus, the OR gate 200 could be eliminated. Because the bi-directional pad 110A is now functionally an input pad only, there is no output signal O1 and there is no need to have the MUX 204 select an output signal. The MUX 204 can therefore be eliminated, and the signal S2 from the bi-directional pad 111A is fed to the inverter 203 where it is inverted. The inverted signal S2' is then fed to the output driver 205. The output driver 205 will output the inverted signal S2' when testing in the EVEN mode.

In another alternative of the same embodiment, the bi-directional pad 110A could be configured functionally as an output only and the bi-directional pad 111A remains functionally bi-directional. In normal operation, the signal S1 would then be an output signal only. This alternative arrangement could be used when the pad 110A is connected to a Light Emitting Diode (LED), for example.

In this alternative, the output enable signal OE1 would always be high, or 1. Thus, the OR gate 200 can be eliminated. Because the AND gate 202 would always receive as inputs, the OE1 signal (always 1) and the inverted ODD test signal 209', the AND gate 202 can also be eliminated. The inverted ODD test signal 209' would then be fed directly to the output driver 205. Thus, when in the EVEN test mode, the pad 110A becomes an output pad, and in the ODD test mode the pad 110A becomes an input pad. The MUX 204 operates to send out either the inverted signal S2' from the bi-directional pad 111A via the inverter 203 or the normal output signal O1. The portion of the input signal line for the input signal I1 can be eliminated after the connection point to the inverter 213.

Figure 5:
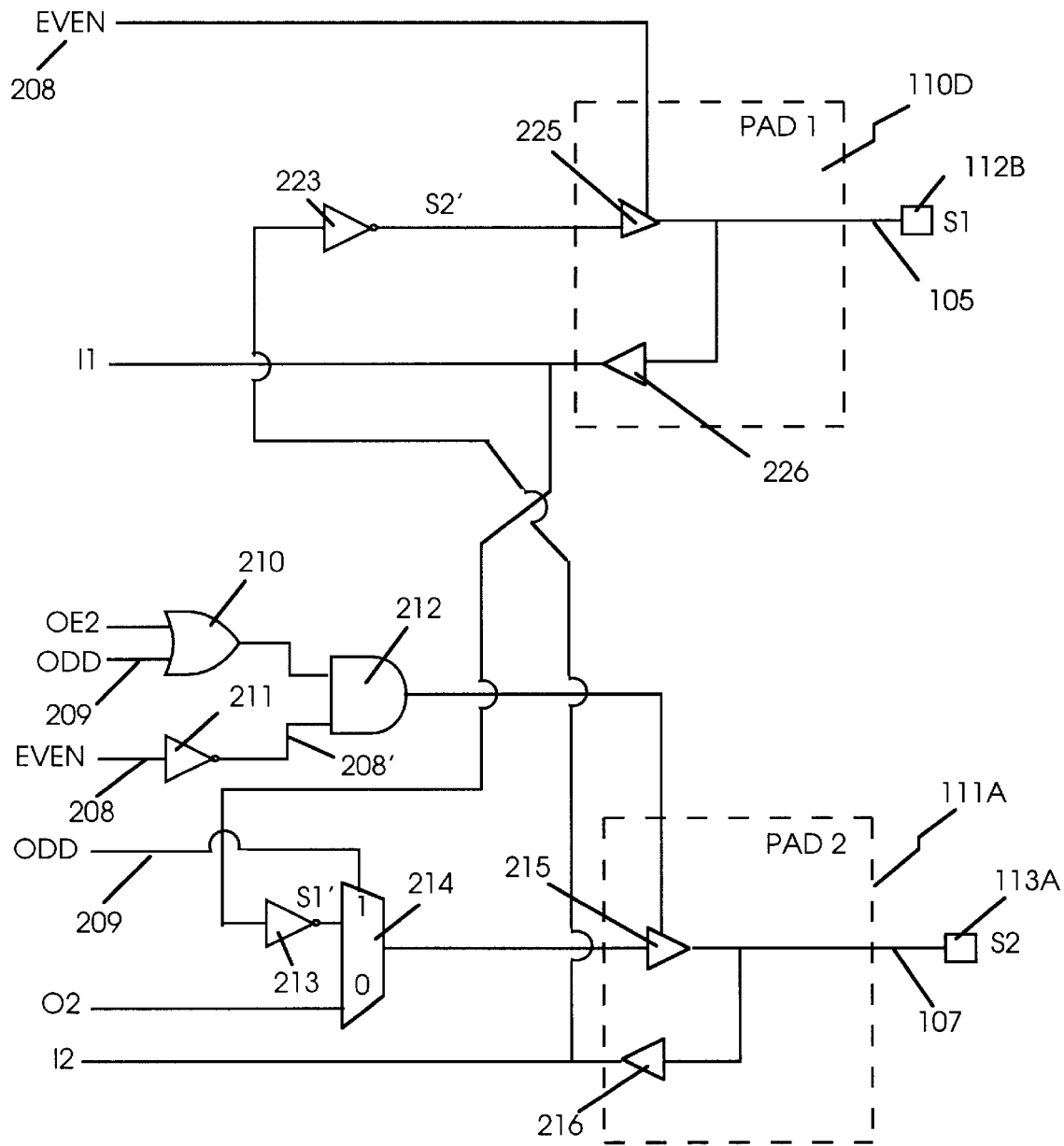
FIG. 5 is a schematic diagram of another embodiment of the invention in which a top pad is configured functionally as an input pad.
Figure 6:
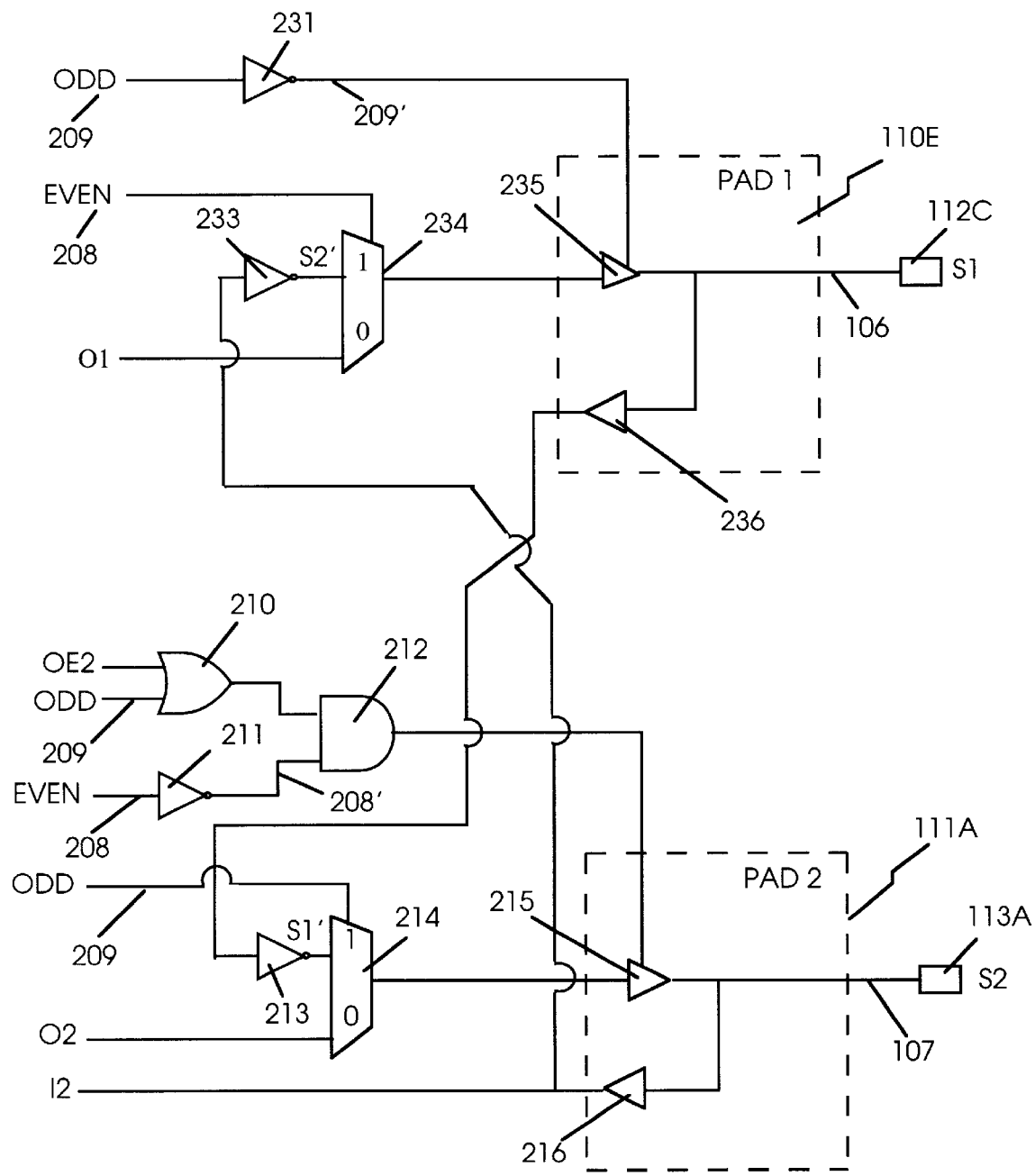
FIG. 6 is a schematic diagram of another embodiment of the invention in which a top pad is configured functionally as an output pad.

FIGS. 5 and 6 show the construction of the applicable test logic and functional components when a pad is configured functionally as an input pad and an output pad, respectively. In FIG. 5, the bi-directional pad 111A remains the same as that shown in FIG. 3. The second pad of the pad pair, pad 110D, is configured functionally as an input pad only. The pad 110D includes an output driver 225 and a receiver 226, and is coupled to off-chip components by the signal path 105. The pad 110D connects to the bi-directional pad 111A via an inverter 223.

When testing the pad pair shown in FIG. 5, the EVEN test signal 208 is set high. The output driver is thus configured to send the inverted signal S2' to the connection 112B.

In FIG. 6, the bi-directional pad 111A remains as shown in FIG. 3. The second pad of the pad pair is an output only pad 110E. The pad 110E includes an output driver 235 and a receiver 236, and is coupled to off-chip components via the signal path 106. The test logic for the pad 110E includes an inverter 231 that receives the ODD test signal 209, an inverter 233 that receives the signal S2 from the bi-directional pad 111A, and a MUX 234. The MUX 234 receives the inverted signal S2' and the output signal O1. When in the EVEN mode, the MUX 234 selects the inverted signal S2' to send to the output driver 235 and to the signal path 106. That is, the ODD test signal 209 is low, or 0, and is inverted by the inverter 231. The output driver 235 is therefore configured to send the inverted signal S2' to the signal path 106.

With the test configurations described above, it now becomes possible to easily and quickly test the input and output sides of all the I/O pads on a chip. This testing may be performed at any stage during the construction of a printed circuit assembly (PCA). For example, the pad can be tested for connectivity after the patterns are formed on the die, after the die is cut from the wafer and packaged, and after the chip is mounted on a printed circuit board (PCB). The connectivity of the pad can be tested in the event of a failure of the PCA while in operation, as for example during failure analysis.

Because the logic components needed to test connectivity can be placed near the pads, the long internal routing normally associated with boundary scan tests are eliminated. Further, the test architecture is much simpler than that needed for boundary scan testing according to the IEEE Standard 1149.1 (JTAG), for example. The simplified test architecture produces negligible additional loading on the chip, and hence negligible affect on circuit timing. Finally, the test architecture described above allows for testing both the input and the output sides of all I/O pads on a chip. This feature is particularly important during chip manufacture and PCB assembly to detect defective components.

The foregoing description of the present invention is presented for purposes of illustration and description. It is not intended to be exhaustive or to limit the invention to the precise form disclosed, and other modifications and variations may be possible in light of the above teachings. The embodiment was also chosen and described in order to best explain the principles of the invention and its practical application to enable others skilled in the art to best utilize the invention in various embodiments and various modifications as are suited to the particular use contemplated.

What is claimed is:

1. A system for testing connectivity of pads on a chip, comprising:

a plurality of pads, wherein the plurality of pads are designated as pad pairs;

a first test logic associated with a first pad of a pad pair, the first pad having a first input and a first output; and a second test logic associated with a second pad of the pad pair, the second pad having a second input and a second output, wherein the first input is coupled to the second output and the second input is coupled to the first output.

2. The system of claim 1, wherein each of the plurality of pads is a bi-directional pad.

3. The system of claim 1, wherein certain ones of the plurality of pads are one of an input pad and an output pad.

4. The system of claim 1, wherein the plurality of pads are tested in an ODD mode and an EVEN mode, and wherein the first pad is designated as an ODD pad and the second pad is designated as an EVEN pad.

5. The system of claim 4, wherein each pad of the plurality of pads includes an output driver and a receiver, wherein test signals input to a pad are received by the receiver and test signals output from the pad are transmitted through the output driver.

6. The system of claim 5, wherein the state of the output driver is controlled by comparison of an output enable signal and an EVEN and an ODD test signal, an output driver for the ODD pad switching to an output state when testing in the EVEN mode and an output driver for the EVEN pad switching to an output state when in the ODD mode.

7. An apparatus for testing semiconductor devices, comprising:
   a first test logic;
   a first pad coupled to the first test logic, wherein the first pad comprises:
      a first output driver, and
      a first receiver, wherein the first output driver operates to send signals from the first pad and the first receiver operates to receive signals at the first pad;
   a second test logic; and
   a second pad coupled to the second test logic, wherein the second pad comprises:
      a second output driver, and
      a second receiver, wherein the second output driver operates to send signals from the second pad and the second receiver operates to receive signals at the second pad, and wherein the second receiver is coupled to the first output driver and the first receiver is coupled to the second output driver.

8. The apparatus of claim 7, wherein the first and the second pads are functional bi-directional pads.

9. The apparatus of claim 8, wherein the first test logic comprises:
   a first OR gate; and
   a first AND gate coupled to the first OR gate and the first output driver, wherein the first OR gate receives one of an output enable signal and an EVEN test signal, the EVEN test signal causing the first AND gate to configure the first output driver to send an input signal received from the second pad as an output signal from the first pad.

10. The apparatus of claim 9, wherein the first test logic further comprises:
   a first inverter; and
   a multiplexer coupled to the first inverter and the first output driver, wherein the first inverter inverts the input signal and the multiplexer selects one of the inverted input signal and an output signal to be sent to the first output driver, the multiplexer selecting the inverted input signal when testing the first pad in an EVEN test mode.

11. The apparatus of claim 8, wherein the second test logic comprises:
   a second OR gate; and
   a second AND gate coupled to the second OR gate and the second output driver, wherein the second OR gate receives one of an output enable signal and an ODD test signal, the ODD test signal causing the second AND gate to configure the second output driver to send an input signal received from the first pad as an output signal from the second pad.

12. The apparatus of claim 11, wherein the second test logic further comprises:
   a second inverter; and
   a multiplexer coupled to the second inverter and the second output driver, wherein the second inverter inverts the input signal and the multiplexer selects one of the inverted input signal and an output signal to be sent to the second output driver, the multiplexer selecting the inverted input signal when testing the first pad in an ODD test mode.

13. The apparatus of claim 7, wherein the first pad is a functional output pad and the second pad is a functional bi-directional pad.

14. The apparatus of claim 13, wherein the first test logic comprises:
   a first inverter coupled to the first output driver, the first inverter receiving an ODD test signal;
   a multiplexer coupled to the first output driver, the multiplexer receiving an EVEN test signal, a first output signal, and an input signal from the second pad; and
   a second inverter coupled to the multiplexer, wherein when in an EVEN test mode, the first inverter inverts the ODD test signal to configure the first output driver to output signals, the second inverter inverts the input signal received from the second pad, and wherein the EVEN test signal configures the multiplexer to send the inverted input signal received from the second pad as an output signal from the first pad through the first output driver.

15. The apparatus of claim 7, wherein the first pad is a functional input pad and the second pad is a functional bi-directional pad.

16. The apparatus of claim 15, wherein the first test logic comprises an EVEN test signal coupled to the first output driver, and wherein when the EVEN test signal is high the first output driver sends an input signal received from the second pad as an output signal from the first pad.

17. A method for testing input and output connectivity of pads on a chip, comprising:
   designating a pad pair comprising two pads;
   applying a first input signal to a first pad of the pad pair;
   inverting the first input signal to produce a first inverted signal;
   receiving the first inverted signal at a second pad of the pad pair; and
   reading the first inverted signal as an output signal of the second pad.

18. The method of claim 17, where the applying step further comprises:
   switching the pad pair to an EVEN test mode; and
   inputting a first test signal and a second test signal to the second pad, the first and the second test signals configuring the second pad as an output pad.

19. The method of claim 17, further comprising comparing the output signal of the second pad with the first input signal.

20. The method of claim 17, wherein the inverting step is performed by an inverter.

21. The method of claim 17, wherein the first inverted signal is processed by a multiplexer, the multiplexer selecting one of the first inverted signal and an output signal to send to the second pad.

22. The method of claim 21, wherein the second pad includes an output driver that receives one of the first inverted signal and the output signal and sends the received signal as the output signal.

23. The method of claim 17, wherein the first input signal is received at a receiver contained on the first pad.

24. The method of claim 17, wherein the chip includes a plurality of designated pad pairs, and wherein the method is completed simultaneously for all of the plurality of designated pad pairs.

25. The method of claim 17, further comprising:
   switching the pad pair to an ODD test mode;
   applying the first test signal and the second test signal to the first pad, the first and the second test signals configuring the first pad as an output pad;
   applying a second input signal to the second pad;
   inverting the second input signal to produce a second inverted signal;

receiving the second inverted input signal at the first pad;

reading the second inverted signal as an output signal of the first pad; and comparing the output signal of the first pad with the second input signal.

26. The method of claim 25, wherein the chip includes a plurality of designated pad pairs and wherein the method is completed simultaneously for all of the plurality of designated pad pairs.

27. The method of claim 17, wherein the first pad and the second pad are functional bi-directional pads.

28. The method of claim 17, wherein the first pad includes a first test logic, the first test logic processing a first test signal and a second test signal to configure the first pad as one of an output pad and an input pad and wherein the second pad includes a second test logic, the second test logic processing the first and the second test signals to configure the second pad as one of the input pad and the output pad.

29. The method of claim 17, wherein the first pad is one of a functional input pad and a functional output pad and the second pad is a functional bi-directional pad.

* * * * *